(12) United States Patent
Cai et al.

(10) Patent No.: US 8,407,037 B2
(45) Date of Patent: Mar. 26, 2013

(54) METHODS AND APPARATUS FOR CLOCK SIMULATION WITH CALIBRATION

(75) Inventors: Lukai Cai, San Diego, CA (US); Mahesh Sridharan, San Diego, CA (US); Tauseef Kazi, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 430 days.

(21) Appl. No.: 12/265,665

(22) Filed: Nov. 5, 2008

(65) Prior Publication Data

US 2010/0114552 A1    May 6, 2010

(51) Int. Cl.
*G06F 17/50* (2006.01)
(52) U.S. Cl. ............................................ 703/19; 703/13
(58) Field of Classification Search .................. None
See application file for complete search history.

(56) References Cited

U.S. PATENT DOCUMENTS

| | | | | |
|---|---|---|---|---|
| 5,654,718 | A * | 8/1997 | Beason et al. | 342/357.62 |
| 7,062,735 | B2 | 6/2006 | Shim | |
| 7,146,211 | B2 * | 12/2006 | Frei et al. | 607/2 |
| 7,188,060 | B1 * | 3/2007 | Adcock | 703/14 |
| 7,272,078 | B1 * | 9/2007 | Haartsen | 368/118 |
| 7,535,417 | B2 * | 5/2009 | Atkinson | 342/357.62 |
| 7,791,211 | B2 | 9/2010 | Chen et al. | |
| 7,791,534 | B1 * | 9/2010 | Zhi et al. | 342/357.22 |
| 7,797,118 | B2 * | 9/2010 | Ashburn et al. | 702/89 |
| 2008/0270959 | A1 * | 10/2008 | Faraboschi et al. | 716/6 |

FOREIGN PATENT DOCUMENTS

EP    1284454 A2    2/2003

OTHER PUBLICATIONS

Tholert et al. "Absolute Calibration of Time Receivers with DLR's GPS/Galileo HW Simulator", Nov. 2007, 29th Annual Precise Time an dTime Interval Meeting, pp. 323-330.*
International Business Machines Corporation: "Efficient method to simulate multiple clock domains in a cycle-simulation model" Research Disclosure, Mason Publications, Hampshire, GB, vol. 464, No. 120, Dec. 1, 2002, XP007131896 ISSN: 0374-4353 p. 1-p. 2.
International Search Report and Written Opinion—PCT/US2009/063452, International Search Authority—European Patent Office—Mar. 10, 2010.
Junghee Lee et al: "Cycle error correction in asynchronous clock modeling for cycle-based simulation" Design Automation, 2006. Asia and South Pacific Conference on Jan. 24, 2006, Piscataway, NJ, USA,IEEE, Jan. 24, 2006, pp. 460-465, XP010899560 ISBN: 978-0-7803-9451-3 p. 460, right-hand column, paragraph 2-p. 462, right-hand column, line.

* cited by examiner

*Primary Examiner* — Suzanne Lo
(74) *Attorney, Agent, or Firm* — William M. Hooks

(57) ABSTRACT

A method for clock modeling in a simulation tool is described. An internal time (I) may be defined that governs the simulator tool's clock period. An external time (E) may be defined. The internal time may have a smaller resolution than the external time. A calibration period (C) may be defined for the clock. The calibration period may be smaller than 0.5E and greater than I. The largest inaccuracy of any clock edge may be monitored, and the clock may be calibrated if the largest inaccuracy is greater than (C−1).

27 Claims, 11 Drawing Sheets

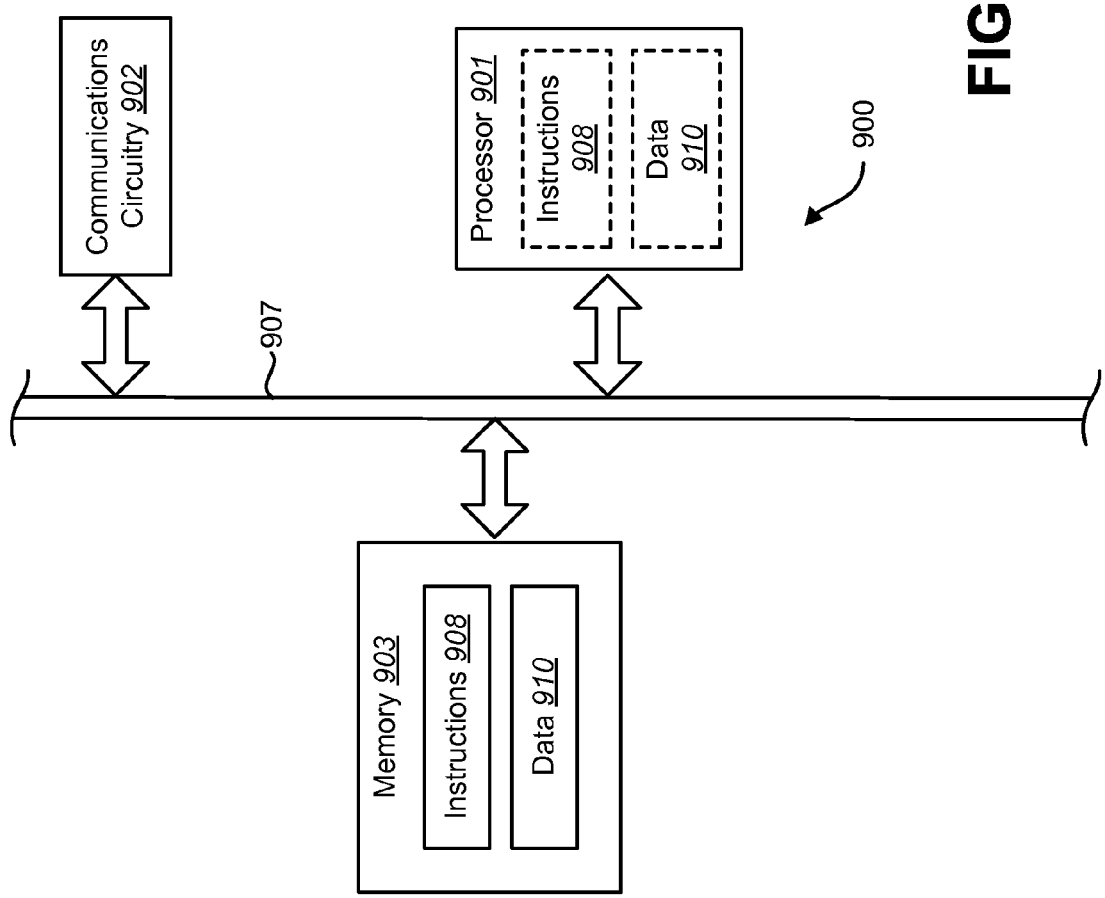

METHODS AND APPARATUS FOR CLOCK SIMULATION WITH CALIBRATION

TECHNICAL FIELD

The present disclosure relates generally to digital system simulations. More specifically, the present disclosure relates to methods and apparatus for improving digital simulation by clock calibration.

BACKGROUND

Electronic devices (computers, cellular telephones, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. This increased complexity has led to an increased need for simulation software that can simulate digital circuits and/or digital systems prior to building them in the complex semiconductor process.

Digital circuits are often dependent on a clock or clocks for timing of the circuits or systems. Specifically, simulation tools (simulators) are used to simulate the behavior of a digital system before fabrication to verify and check functionality. In other words, it can be very expensive to manufacture a chip containing a circuit for a digital device. Accordingly, in order to reduce costs, the functionality of the circuit is generally simulated using a simulator before the circuit/chip is ever fabricated. However, in order for any simulation to be accurate, the timing of the clocks associated with the simulator must be accurate. Benefits may be realized by providing improved simulation software/methods with improved clock-calibration capabilities.

BRIEF DESCRIPTION OF THE DRAWINGS

FIG. 9 illustrates part of a hardware implementation of an apparatus for improving digital simulation speed via clock calibration.

DETAILED DESCRIPTION

Figure 1:
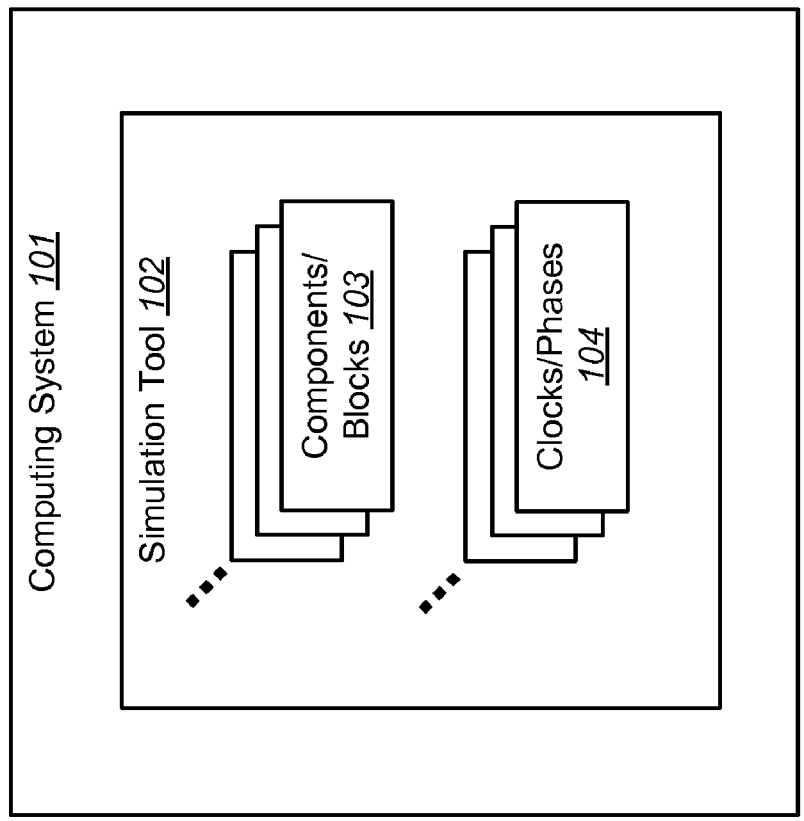
FIG. 1 illustrates an example of a simulation tool implemented within a computing system.

An apparatus for clock modeling in a simulation tool includes a processor and memory in electronic communication with the processor. The apparatus includes instructions stored in the memory that are executable by the processor to define an internal time (I) that governs a period of a clock that is simulated by the simulation tool. The apparatus also includes instructions executable to define an external time (E). The internal time (I) has a smaller resolution than the external time (E). The apparatus may also include instructions executable to define a calibration period (C) for the clock, which may be smaller than 0.5E and greater than I. The apparatus may also include instructions executable to monitor whether a largest inaccuracy of any clock edge is greater than (C−1) and to calibrate the clock if the largest inaccuracy of any clock edge is greater than (C−1).

In one configuration, the inaccuracy of a clock edge is a difference between when the edge is supposed to happen in a real clock and when the edge actually happens in the simulation tool. Furthermore, the external time may be defined by a user of the apparatus. The calibrating may include adjusting the clock such that all inaccuracies of clock edges are not greater than I.

The instructions on the apparatus may also be executable to define I, E, and C for a plurality of clocks, to monitor the largest inaccuracy of edges of the clocks, and to calibrate the clocks if the largest inaccuracy of any clock edge is greater than (C−1).

Furthermore, two clocks may be treated as synchronous if a difference between their adjacent edges is smaller than E.

A method for clock modeling in a simulation tool is also described. An internal time (I) is defined that governs a period of a clock that is simulated by the simulation tool. An external time (E) is defined. The internal time (I) has a smaller resolution than the external time (E). A calibration period (C) is defined for the clock, which may be smaller than 0.5E and greater than I. The method monitors whether a largest inaccuracy of any clock edge is greater than (C−1). The clock is calibrated if the largest inaccuracy of any clock edge is greater than (C−1).

The method may provide that an inaccuracy of a distance between any adjacent edges of two different clocks is smaller than 2C (=1E).

An apparatus for clock modeling in a simulation tool is also described. The apparatus may include means for defining an internal time (I) that governs the period of a clock that is simulated by the simulation tool. The apparatus may also include a means for defining an external time (E). The internal time (I) may have a smaller resolution than the external time (E). The apparatus may also include means for defining a calibration period (C) for the clock, which may be smaller than 0.5E and greater than I. The apparatus may also include means for monitoring whether the largest inaccuracy of any clock edge is greater than (C−1) and means for calibrating the clock if the largest inaccuracy of any clock edge is greater than (C−1).

A computer program-product for clock modeling in a simulation tool including a computer-readable medium having instructions is also described. The instructions may include code for defining an internal time (I) that governs the period of a clock that is simulated by the simulation tool. The instructions may also include code for defining an external time (E). The internal time (I) may have a smaller resolution than the external time (E). The instructions may also include code for defining a calibration period (C) for the clock, which may be smaller than 0.5E and greater than I. The instructions may also include code for monitoring whether the largest inaccuracy of any clock edge is greater than (C−1) and code for calibrating the clock if the largest inaccuracy of any clock edge is greater than (C−1).

FIG. 1 illustrates an example 100 of a simulation tool 102 implemented within a computing system 101. Simulation tools 102 may be used to simulate the behavior of a digital system or digital components 103. Simulation tools 102 may be used to verify hardware before fabrication to verify functionality.

The computing system 101 is not limited to a computer system using a specific type of hardware or operating system. For example, the computing system 101 may be a one-board type of computer, such as a controller or a blade server, a typical desktop computer, a Windows®-based system, a Unix®-based system, a Sun Solaris® system, a Linux®-based system, a distributed system with multiple computing devices, etc. The computing system 101 of FIG. 1 may include a simulation tool 102. The simulation tool 102 may include one or more executable programs, libraries and/or sets of data.

The simulation tool 102 may be used to simulate digital systems and/or digital components 103. For example, the simulation tool 102 may be used to simulate the digital circuitry in a cellular phone. The simulation tool 102 may represent one or more digital components/blocks 103. Digital components 103 may include certain chips, integrated circuits, transistors, digital building blocks such as logic gates, etc. The simulation tool 102 may represent one or more clock cycles 104. A represented clock cycle 104 may be referred to as a phase 104.

Simulation tools 102 may be used to simulate the behavior of a digital system before fabrication to verify functionality. It may be desirable for a simulator to model the behavior of system clocks correctly in order to accurately model the digital system as a whole. As such, the accuracy of the simulated clocks 104 may be very important. Synchronization relationships among clocks may be preserved, i.e., the rising edges of two clocks may be aligned at the least common multiple of their periods. This may be done in order to ensure the accuracy of the simulated clocks 104 and thus the simulation tool 102 as a whole.

Figure 2:
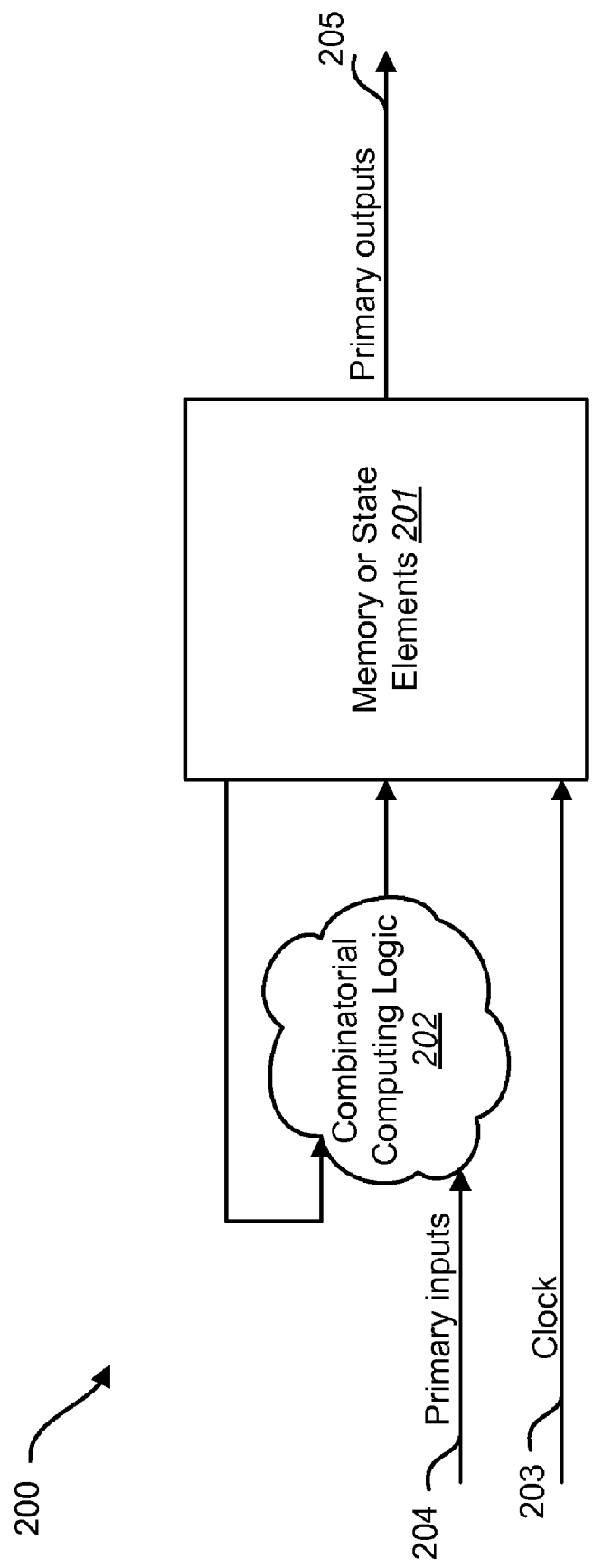
FIG. 2 illustrates an example of components used in a digital system that may be modeled with a simulation tool.

FIG. 2 illustrates an example of some of the components that may be used in a digital system 200 that may be modeled with a simulation tool 102. Synchronous digital systems 200 may include memory or state elements 201 and combinatorial logic 202. Clocks 203 may be essential components of digital systems 200.

The digital system 200 may process a series of input sets 204 and generate a series of output sets 205, one set at a time on one or more edges of the clock 203. Processing may occur on both edges but outputs 205 may be generated on only the positive edge, only the negative edge or on both edges.

Figure 3:
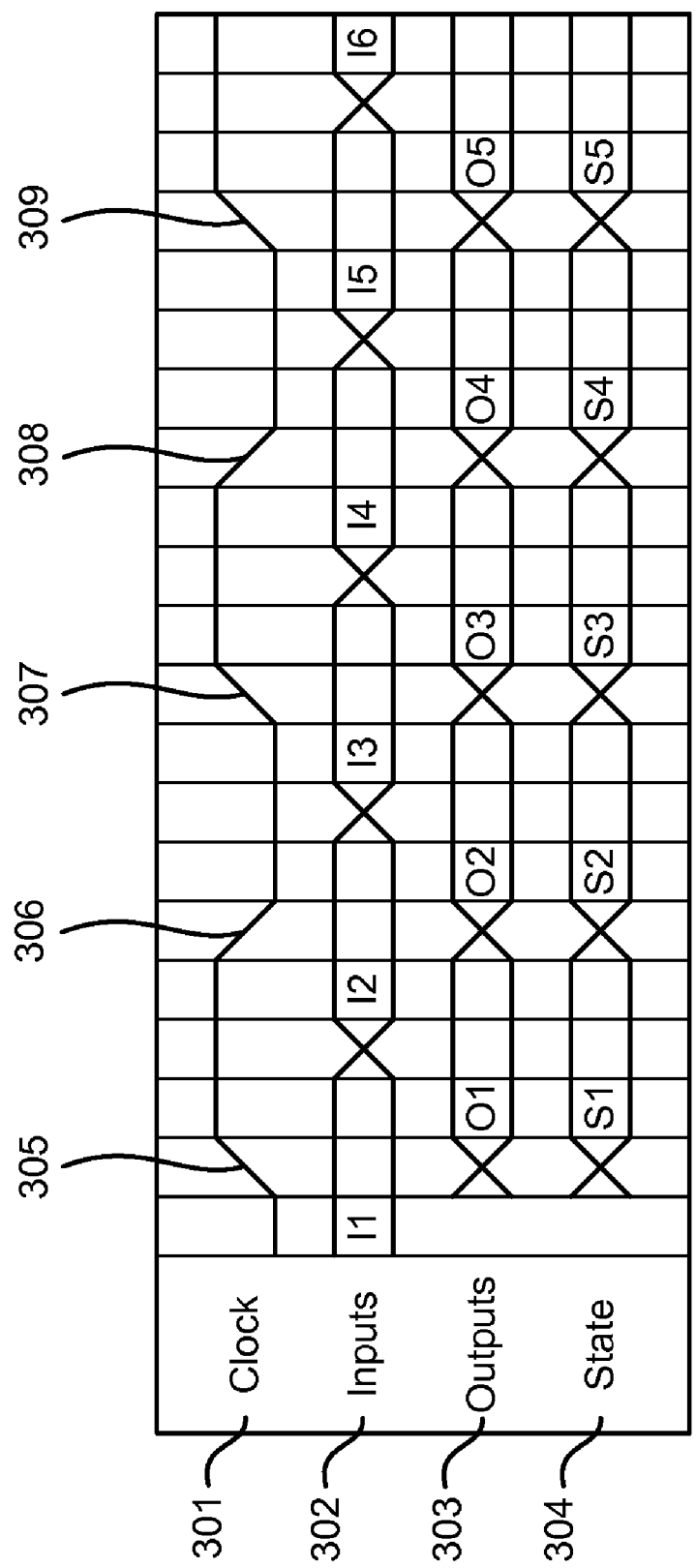
FIG. 3 illustrates an example of the behavior of a system that is sensitive on both edges of a clock signal.

FIG. 3 illustrates an example of the behavior of a system that is sensitive on both edges of the clock signal 301. The system may change states 304 and generate a new output 303 at every clock 301 edge. Inputs 302 are represented as I1-I6. Outputs 303 are represented as O1-O5. Various states 304 of the system are represented as S1-S5. As shown, a clock transition 305, where the input 302 is I1, may cause the output 303 to change to O1 and the state 304 to change to S1. Another clock transition 306, where the input 302 is I2, may cause the output 303 to change to O2 and the state 304 to change to S2. Other clock transitions 307-309 may similarly cause changes to the outputs 303 and the state 304. The large number of changes to the outputs 303 may decrease the simulation speed.

Figure 4:
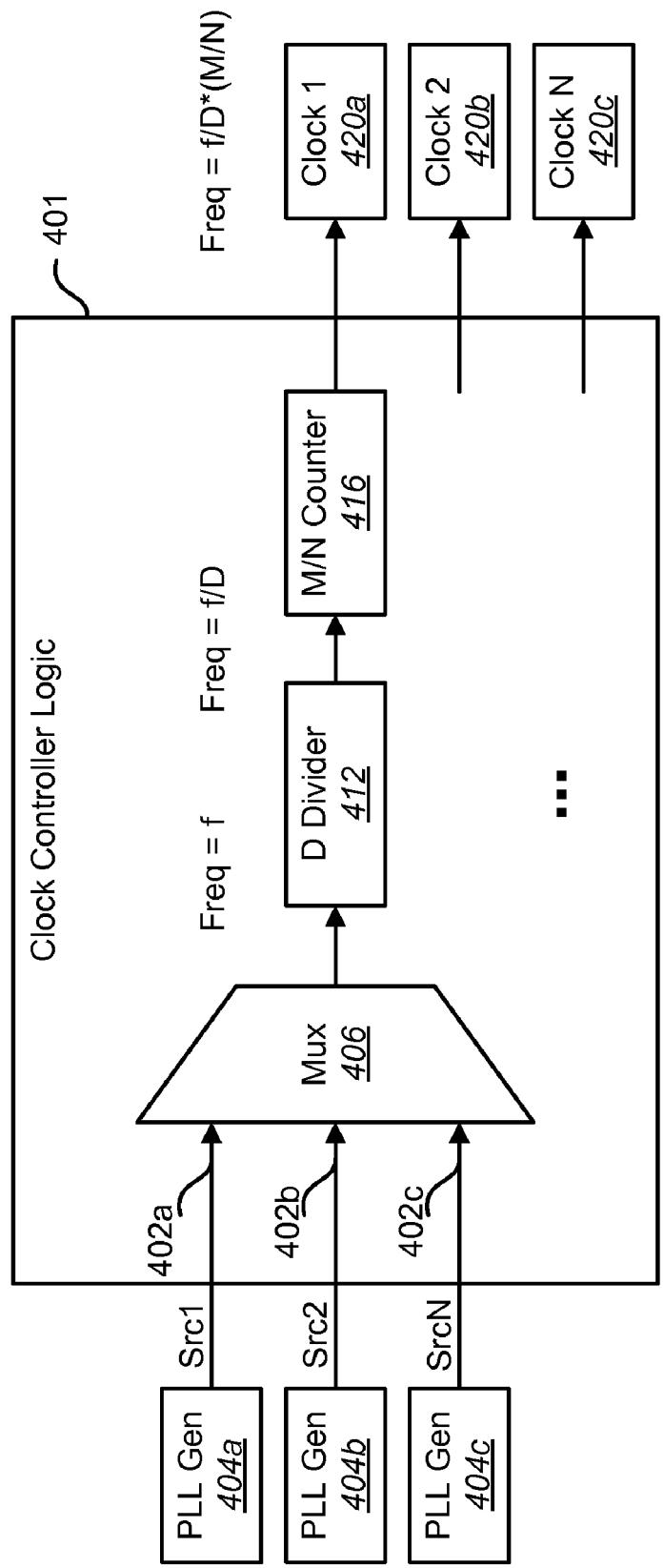
FIG. 4 illustrates an example of clock controller logic that may be implemented in a digital system.

FIG. 4 illustrates an example of clock controller logic 401. Clock controller logic 401 may be responsible for generating one or more clocks 420a-c for a digital system (or simulator). The inputs of the clock controller logic 401 may be phase lock loop (PLL) sources 402a-c from PLL generators 404a-c. Multiple PLL generators 404a-c may be used, as desired. The clock controller logic 401 may include a Mux (multiplexer) 406 that receives the sources 402a-c as inputs. The Mux 406 may first select a source 402 with which to drive a clock 420. The frequency of a selected source 402 is denoted as f. The D divider 412 may divide the clock frequency by a factor D. Thus, the output frequency of the D divider 412 may equal f/D. Finally, a counter 416 may further generate the final clock frequency as f/D*(M/N), where M/N is smaller than 1. The clock controller logic 401 ensures the timing for the generated clock edge is accurate based on the equation f/D*(M/N).

As can be seen in FIG. 4, there may be multiple clocks 420a-c that are driven by the clock controller logic 401. The Mux 406 may be responsible for selecting which source 402 will be used to drive each particular clock 420.

Figure 5:
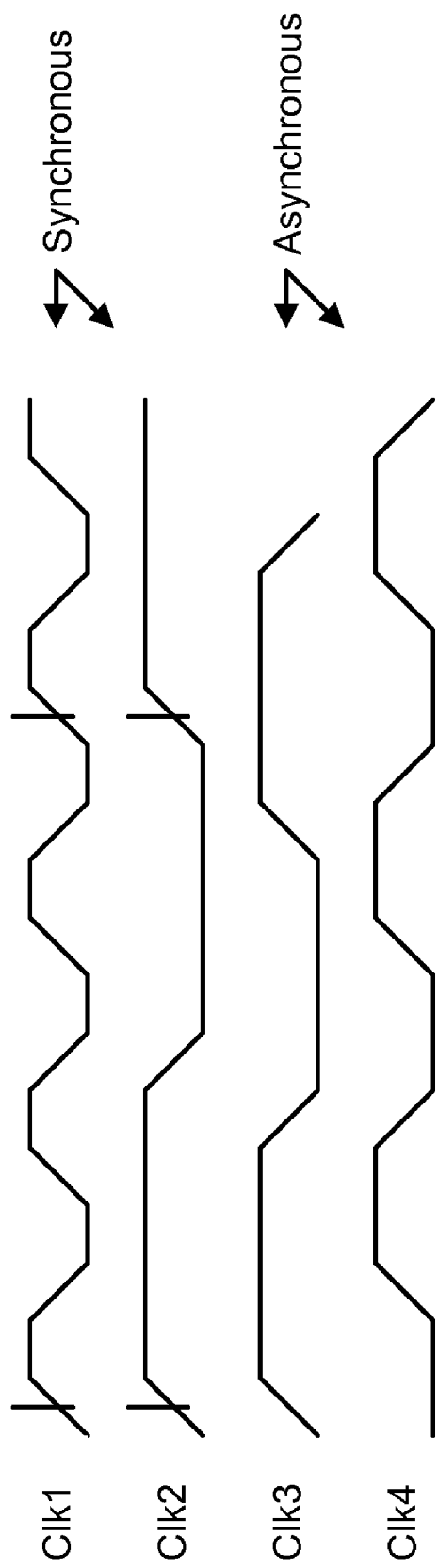
FIG. 5 illustrates an example of the behavior of synchronous and asynchronous clocks.

There are at least two types of relationships between two clocks 420 as illustrated in FIG. 4: asynchronous and synchronous. If two clocks 420 have an asynchronous relationship, then the two clocks 420 may be independent of each other. If two clocks 420 have a synchronous relationship, then the rising edges of the two clocks 420 may be aligned at the least common multiple of their periods. FIG. 5 illustrates a waveform showing the difference between synchronous and asynchronous clocks.

It should be noted that violating the synchronous relationship may cause incorrect functionality in a design. In other words, if two clocks are supposed to be synchronous, but are not synchronous during a simulation, the simulator may not simulate accurately.

A brief description of simulation tools will now be described. As noted above, simulation tools (or simulators) may be used to simulate the behavior of a digital system before fabrication to verify functionality. It may be important for a simulator to model the behavior of the system correctly. Modeling a clock correctly may be critical for the simulation accuracy. One method of evaluating clock accuracy is whether the synchronization relationship between one or more clocks is preserved.

There are two types of clock modeling that may be used for simulation, namely (1) design-based modeling and (2) period-based modeling. Design-based modeling may model clocks following the actual design introduced above in conjunction with FIG. 4. This method may ensure the timing accuracy and preserve the clock relationships. However, the major disadvantage is that the implementation may be very complicated, and thus the simulation speed may be very slow.

Figure 6:
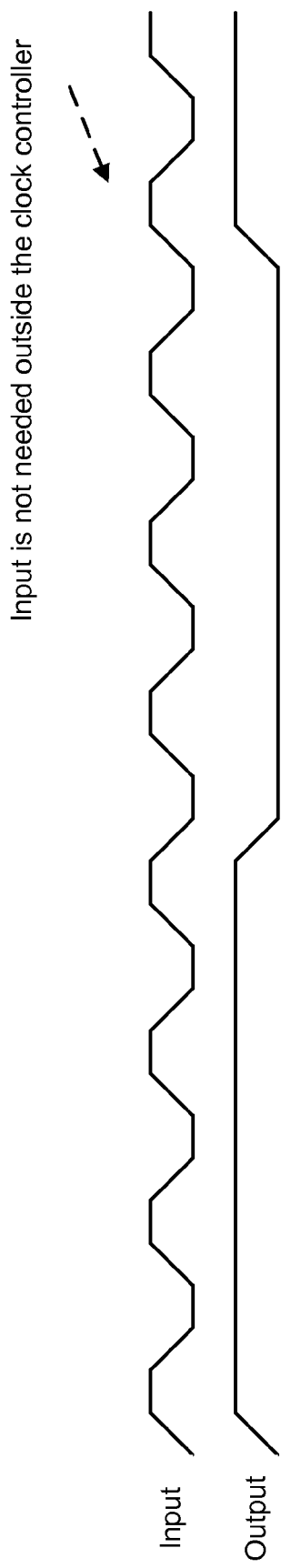
FIG. 6 illustrates the inputs and outputs of a clock that is modeled using a design-based modeling system.

To illustrate the complexity, take for example, the implementation of D Divider 412 as an example. The D divider 412 may include a counter, which increases by one at each input's edge. The D divider 412 may also include a comparator. When the counter's value equals D, it may generate an output clock edge and reset the counter. In such an implementation, the simulation speed may be very slow because a simulator may be required to model not only the output clock of D divider 412, but also an input source which may be 100 times faster than the output clock (D>100) and is not used outside the clock controller 401. This example is shown in FIG. 6 and illustrates the IO (input/output) of the implementation of D Divider 412 that was just described, where D is equal to 8.

The implementations of PLL generator 404 and M/N counter 416 may be much more complicated than the implementation of D Divider 412. Thus, design-based modeling systems may be relatively slow.

The other type of modeling is "period-based modeling" in which clocks are modeled based on their periods. The system may first define the resolution of the particular time unit. For example, the time unit may be selected to be 1 picosecond. Next, the system may generate clock edges at a multiple of the time unit (e.g. if a clock period is 3000 ps, then the first rising edge of the clock may be generated at 3000 ps, the second rising edge may be generated at 6000 ps, etc.).

This modeling technique has disadvantages. This modeling approach cannot accurately model the clock whose period cannot be dividable by the time unit. For example, if a clock period is 333.3333 ps, then the system may generate the first rising edge at 333 ps and there is an inherent inaccuracy with this model of 0.3333 ps. The modeling inaccuracy may be further accumulated when more clock edges are generated. For example, in this case, the $2,000^{th}$ rising edge may be at 666000 ps, with an inaccuracy of 666.6 ps, which is close to 2 full cycle periods. Thus, in this system, as of the $2000^{th}$ cycle, the clock may be off (unsynchronized) by two full cycles. This means that the synchronous relationship between clocks may not be maintained in the simulation. Accordingly, since the synchronous relationship cannot be maintained, the simulation will not be accurate.

The present embodiments are designed to use the "period-based modeling" approach with an additional calibration technique that makes the system more accurate. The present techniques may guarantee that the simulation time users see will never deviate more than 0.5 times the minimum resolution (e.g., <0.5 ps when the resolution is 1 picosecond).

The technique may be described as follows. The modeling technique may define two time units: (1) an internal time unit (symbolized as "I"); and (2) a user-defined external time unit (symbolized as "E"). I may have a much smaller resolution than E. For example, if E is 1 nanosecond ("ns"), then I may be set at $10^{-3}$ ns (e.g. 1 ps). In this example, I would be 1000 times less than E. E may be chosen by the user as the standard unit that is smaller than the smallest period, e.g., 1 ns, 1 ps, 1 ms. As an example, if a user were trying to simulate a digital system where the fastest timer had a frequency of 100 MHz, the user may select E as 1 nanosecond. As another example, if a user were trying to simulate a digital system where the fastest timer had a frequency of 10 GHz, the user may select E as 1 picosecond.

The clock period for the simulation (period-based modeling) may be computed internally using I. In other words, where E=1 ns and I=1 ps, then E=1000I. Thus, inaccuracy of one clock period may be limited to I since even if I does not divide evenly into E, the simulation may introduce an inaccuracy of only a fraction of I in a period of E. On the other hand, users view the clock edge in terms of E. In such a system, having I and E may guarantee that it takes at least E/I cycles for the time to deviate by E.

An example of this concept is now provided. For example, suppose a user desired to simulate a digital system where the fastest timer had a frequency of 10 GHz. The user may select E=1 ps (as the standard unit smaller than the smallest period in the digital system) and the simulator may select I=$10^{-3}$ ps for a clock with a period of 333.3333 ps. The period of the simulated clock could be expressed internally as 333333I. So, every period of E, there would be inaccuracy, but it would be limited to I (e.g. 0.3I). On the other hand, users view the clock edge in terms of E (e.g. 333E). In such a system, having I and E may guarantee that it takes at least E/I cycles for the time to deviate by E. If E is 1 ps and I is $10^{-3}$ ps, then it would take literally $10^3$ cycles (1000 cycles) for the time to deviate by E (1 picosecond).

In addition to defining time in terms of E and I, a calibration period (referred to herein as "C") may be defined in terms of I. The calibration period may be smaller than 0.5E and greater than I. During the simulation, the system may monitor the largest inaccuracy of any clock edge. Here, inaccuracy is defined as the difference between the time when the edge is supposed to happen in a real system and the time when it actually happens in simulation. As long as the largest inaccuracy is greater than (C−1), the system may calibrate all the clocks. (By knowing when the edge is supposed to happen and when it is actually happening, appropriate adjustment/calibration may be performed). Since C is defined in terms of I, a value of (C=300) may actually denote that (C=300I), so (C−1)=(C−I). Thus, once an inaccuracy in the simulator is greater than (C−1), the simulator may correct the simulated clock(s) to reflect the real time. After the calibration, the inaccuracy may go down to I or less. In other words, calibration may be the adjusting of the simulated clock(s) to match the real time within an error of I. The inaccuracy of any clock edge may never exceed C. Since C is smaller than 0.5E, the inaccuracy of the clock may also be less than 0.5E. This technique of calibration may also ensure that the inaccuracy of the distance between any adjacent edges of two different clocks is smaller than 2C (=1E).

If the distance of any adjacent edges of two different clocks is smaller than 2C, then the simulation system may treat these two clock edges as "synchronous." In this way, the calibration may ensure the synchronization relationship of clocks. It should be noted that this technique involving calibration may have much faster simulation speed than the design-based modeling approach. Meanwhile, it may ensure the timing accuracy of simulated clock(s), and the synchronization relationship of clocks during the simulation may be maintained (which cannot be achieved by traditional period-based modeling).

Figure 7:
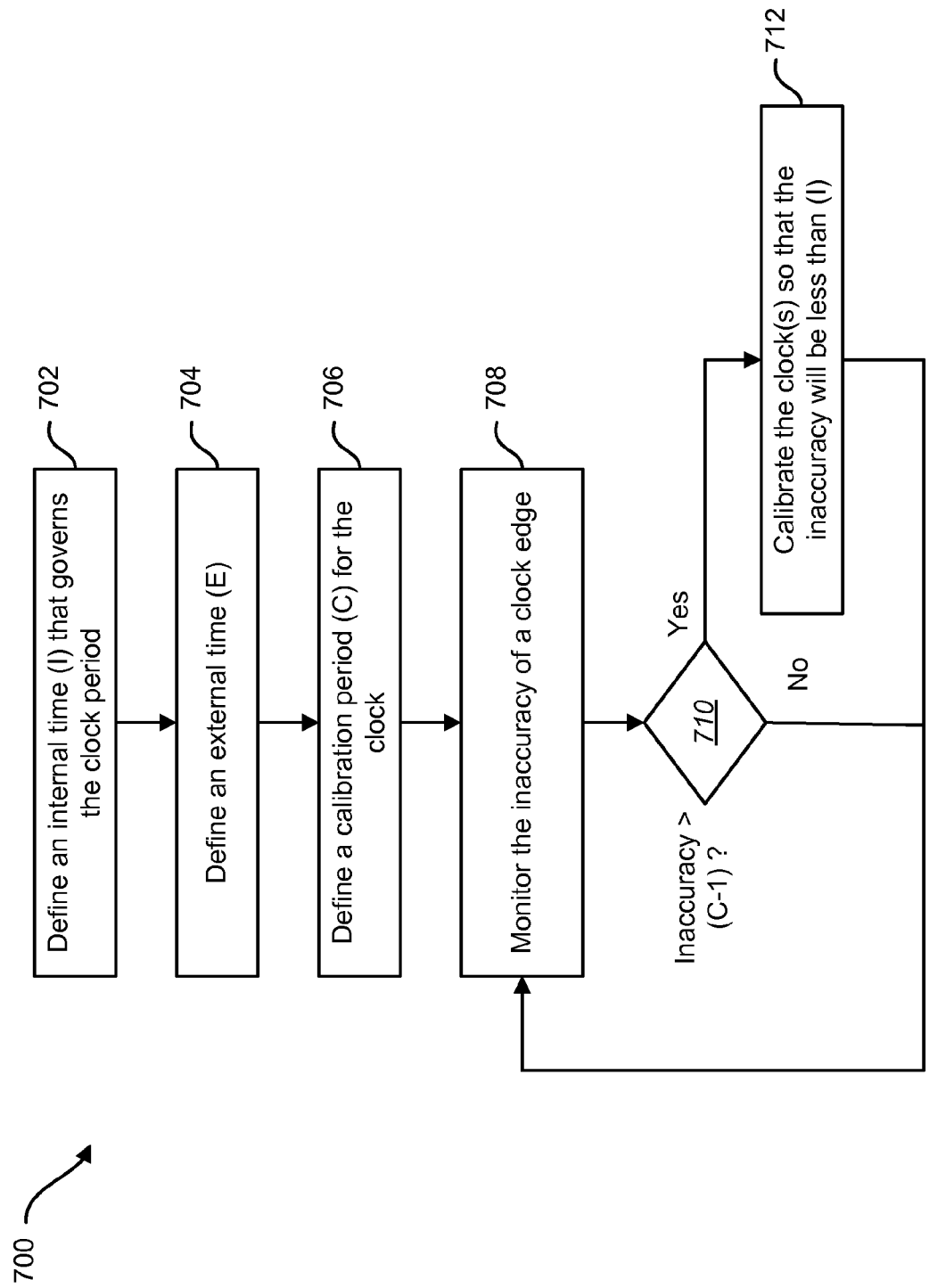
FIG. 7 is a flow diagram illustrating a method of calibrating clocks in a digital system according to the present embodiments.

FIG. 7 represents a flow diagram of a method 700 according to the present embodiments. The method 700 involves calibrating clocks in a digital system. In the method, an internal time (I) may be defined 702. This time may govern the clock period. An external time (E) may also be defined 704. A calibration period (C) for the clock may also be defined 706. The clock periods may then be monitored. More specifically, the largest inaccuracy of any clock edge may be monitored 708 to determine 710 whether the inaccuracy, or the difference in time between when a clock edge is supposed to happen in the real system and when it actually happens in the simulation, is greater than (C−1). If this inaccuracy is greater than (C−1), the clocks may be calibrated 712 and the inaccuracy may be reduced to I or less. If the inaccuracy is not greater than (C−1), the clocks may not be calibrated at that point.

This method 700 may ensure that the inaccuracy of any clock edge will not exceed C or 0.5E. It may also ensure that the inaccuracy of the distance between any adjacent edges of two different clocks is smaller than 2C (=1E). This may preserve the timing accuracy of simulated clock(s), and the synchronization relationship of clocks during the simulation may be maintained.

Figure 7A:
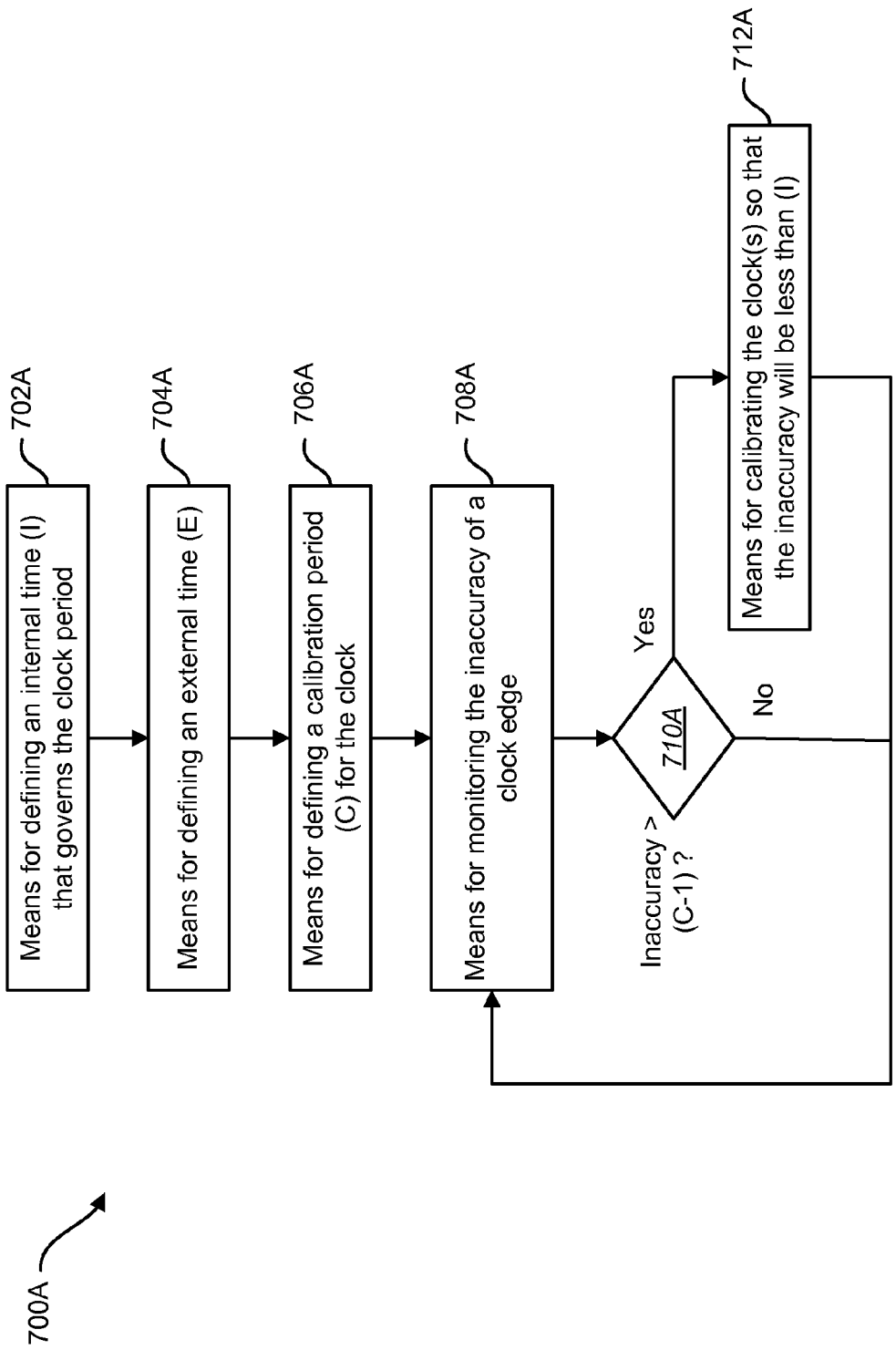
FIG. 7A illustrates means-plus-function blocks corresponding to the method of FIG. 7.

The method 700 of FIG. 7 described above may be performed by various hardware and/or software component(s) and/or module(s) corresponding to the means-plus-function blocks 700A illustrated in FIG. 7A. In other words, blocks 702 through 712 illustrated in FIG. 7 correspond to means-plus-function blocks 702A through 712A illustrated in FIG. 7A.

Figure 8:
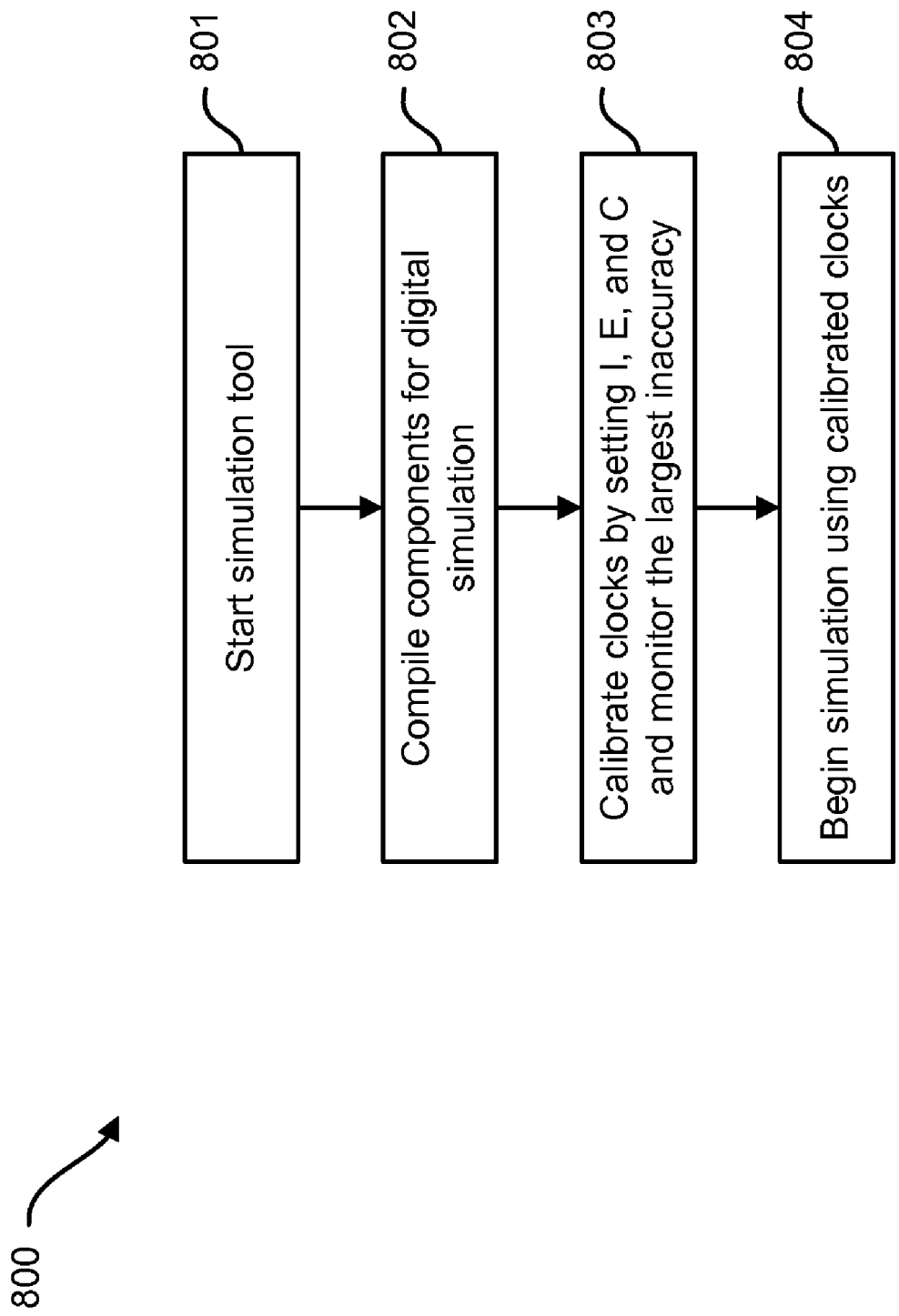
FIG. 8 is a flow diagram of a method for improving digital simulation clock calibration.

FIG. 8 is a flow diagram of a method 800 for improving digital simulation speed by the present embodiments. In the depicted method 800, a simulation tool 102 may begin 801 running on a computing device 101. The simulation tool 102 may compile or load 802 various digital components 103 for use in a digital simulation. The simulation tool 102 may then calibrate 803 the clocks by setting I, E, and C and monitor the largest inaccuracy (as described in greater detail herein). The simulation tool 102 may then begin 804 the simulation.

Figure 8A:
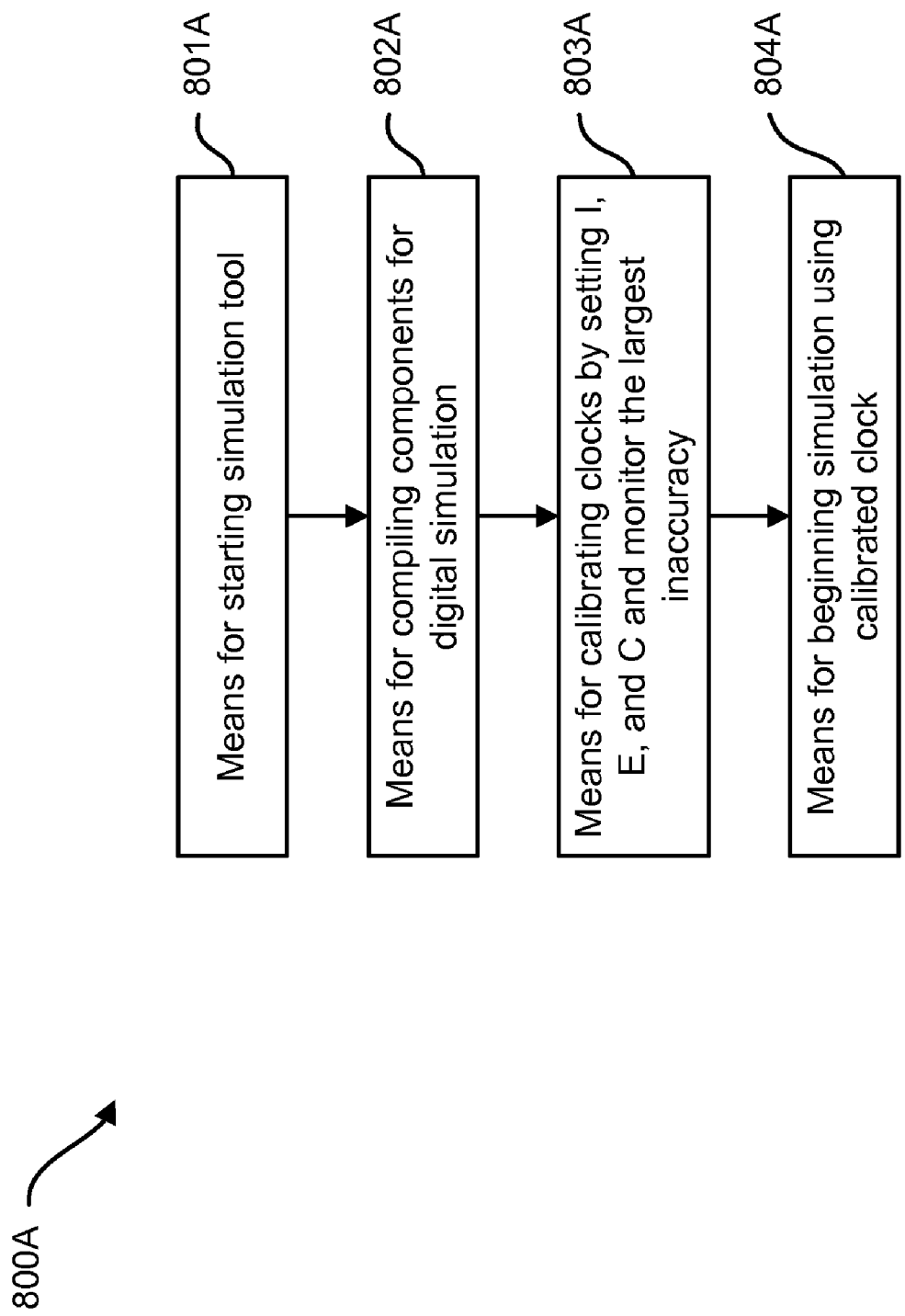
FIG. 8A illustrates means-plus-function blocks corresponding to the method of FIG. 8.

The method 800 of FIG. 8 described above may be performed by various hardware and/or software component(s) and/or module(s) corresponding to the means-plus-function blocks 800A illustrated in FIG. 8A. In other words, blocks 801 through 804 illustrated in FIG. 8 correspond to means-plus-function blocks 801A through 804A illustrated in FIG. 8A.

FIG. 9 illustrates part of a hardware implementation of an apparatus for improving digital simulation using clock simulation with calibration. The apparatus is signified by the reference numeral 900 and may be implemented in various computing devices.

The apparatus 900 may include a central data bus 907 linking several circuits, electronic components or boards together. The circuits/boards/electronic components may include a CPU (Central Processing Unit) or a processor 901, a communications circuit 902 (such as a network card), and memory 903.

The communications circuit 902 may be configured for receiving data from and sending data to other apparatuses (e.g., other hardware units) via wired connections. The CPU/processor 901 may perform the function of data management of the data bus 907 and further the function of general data processing, including executing the instructional contents of the memory 903.

The memory 903 may be any electronic component capable of storing electronic information. The memory 903 may be embodied as random access memory (RAM), read only memory (ROM), magnetic disk storage media (e.g., a hard drive), optical storage media, flash memory devices in RAM, on-board memory included with the processor, EPROM memory, EEPROM memory, registers, and so forth, including combinations thereof.

Data 910 and instructions 908 may be stored in the memory 903. The instructions 908 may be executable by the processor 901 to implement the methods disclosed herein. Executing the instructions 908 may involve the use of the data 910 that is stored in the memory 903.

The memory 903 may include the operating system for the apparatus 900 (e.g., Windows®, Linux®, Unix®, etc.). The memory 903 may include a simulation tool, such as the simulation tool 102 that is shown in FIG. 1. As described above, the simulation tool may be capable of simulating the model of any digital hardware. The simulation tool may provide hooks to enable/disable clocks and phases. Data 910 for the simulation tool may include the model of the digital hardware, which may model the behavior of the digital hardware and control clock phases to speed up simulation.

In the above description, reference numbers have sometimes been used in connection with various terms. Where a term is used in connection with a reference number, this is meant to refer to a specific element that is shown in one or more of the Figures. Where a term is used without a reference number, this is meant to refer generally to the term without limitation to any particular Figure.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements. The terms "instructions" and "code" may be used interchangeably herein.

The functions described herein may be implemented in hardware, software, firmware, or any combination thereof. If implemented in software, the functions may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 7 and 8, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An apparatus for clock modeling in a simulation tool, the apparatus comprising:
    a processor;
    memory in electronic communication with the processor;
    instructions stored in the memory, the instructions being executable by the processor to:
        define an internal time (I) that governs a period of a clock in a digital system that is simulated by the simulation tool;
        define an external time (E), wherein the internal time has a smaller resolution than the external time, wherein E is smaller than a smallest clock period in the digital system;
        define a calibration period (C) for the clock, wherein the calibration period is smaller than 0.5E and greater than I;
        monitor whether a largest inaccuracy of any clock edge is greater than (C−I); and
        calibrate the clock based on a determination that the largest inaccuracy of any clock edge is greater than (C−I).

2. The apparatus of claim 1, wherein an inaccuracy of a clock edge is a difference between when the edge is supposed to happen in a real clock and when the edge happens in the simulation tool.

3. The apparatus of claim 1, wherein the external time is defined by a user of the apparatus.

4. The apparatus of claim 1, wherein the calibrating comprises adjusting the clock such that all inaccuracies of clock edges are not greater than I.

5. The apparatus of claim 1, wherein the instructions are also executable to:
    define I, E, and C for a plurality of clocks;
    monitor the largest inaccuracy of edges of the clocks; and
    calibrate the clocks if the largest inaccuracy of any clock edge is greater than (C−I).

6. The apparatus of claim 1, wherein two clocks are treated as synchronous if a difference between their adjacent edges is smaller than 2C.

7. A method for clock modeling in a simulation tool, the method comprising:
    defining an internal time (I) that governs a period of a clock in a digital system that is simulated by the simulation tool;
    defining an external time (E), wherein the internal time has a smaller resolution than the external time, wherein E is smaller than a smallest clock period in the digital system;
    defining a calibration period (C) for the clock, wherein the calibration period is smaller than 0.5E and greater than I;
    monitoring whether a largest inaccuracy of any clock edge is greater than (C−I); and
    calibrating the clock based on a determination that the largest inaccuracy of any clock edge is greater than (C−I).

8. The method of claim 7, wherein an inaccuracy of a clock edge is a difference between when the edge is supposed to happen in a real clock and when the edge happens in the simulation tool.

9. The method of claim 7, wherein the method ensures that an inaccuracy of a distance between any adjacent edges of two different clocks is smaller than 2C.

10. The method of claim 7, wherein the external time (E) is defined by a user of the simulation tool.

11. The method of claim 7, wherein the calibrating comprises adjusting the clock such that all inaccuracies of clock edges are not greater than I.

12. The method of claim 7, further comprising:
    defining I, E, and C for a plurality of clocks;
    monitoring the largest inaccuracy of edges of the clocks; and
    calibrating the clocks if the largest inaccuracy of any clock edge is greater than (C−I).

13. The method of claim 7, wherein two clocks are treated as synchronous if a difference between their adjacent edges is smaller than 2C.

14. An apparatus for clock modeling in a simulation tool, the apparatus comprising:
    means for defining an internal time (I) that governs a period of a clock in a digital system that is simulated by the simulation tool;
    means for defining an external time (E), wherein the internal time has a smaller resolution than the external time, wherein E is smaller than a smallest clock period in the digital system;
    means for defining a calibration period (C) for the clock, wherein the calibration period is smaller than 0.5E and greater than I;
    means for monitoring whether a largest inaccuracy of any clock edge is greater than (C−I); and
    means for calibrating the clock based on a determination that the largest inaccuracy of any clock edge is greater than (C−I).

15. The apparatus of claim 14, wherein an inaccuracy of a clock edge is a difference between when the edge is supposed to happen in a real clock and when the edge happens in the simulation tool.

16. The apparatus of claim 14, wherein the external time (E) is defined by a user of the simulation tool.

17. The apparatus of claim 14, wherein the means for calibrating comprises means for adjusting the clock such that all inaccuracies of clock edges are not greater than I.

18. The apparatus of claim 14, further comprising:
    means for defining I, E, and C for a plurality of clocks;
    means for monitoring the largest inaccuracy of edges of the clocks; and means for calibrating the clocks if the largest inaccuracy of any clock edge is greater than (C−I).

19. The apparatus of claim 14, wherein two clocks are treated as synchronous if a difference between their adjacent edges is smaller than 2C.

20. A computer-program product for clock modeling in a simulation tool, the computer-program product comprising a non-transitory computer-readable medium having instructions thereon, the instructions comprising:
   code for defining an internal time (I) that governs a period of a clock in a digital system that is simulated by the simulation tool;
   code for defining an external time (E), wherein the internal time has a smaller resolution than the external time, wherein E is smaller than a smallest clock period in the digital system;
   code for defining a calibration period (C) for the clock, wherein the calibration period is smaller than 0.5E and greater than I;
   code for monitoring whether a largest inaccuracy of any clock edge is greater than (C−I); and
   code for calibrating the clock based on a determination that the largest inaccuracy of any clock edge is greater than (C−I).

21. The computer-program product of claim 20, wherein an inaccuracy of a clock edge is a difference between when the edge is supposed to happen in a real clock and when the edge happens in the simulation tool.

22. The computer-program product of claim 20, wherein the instructions further comprise code for ensuring that an inaccuracy of a distance between any adjacent edges of two different clocks is smaller than 2C.

23. The computer-program product of claim 20, wherein the external time (E) is defined by a user of the simulation tool.

24. The computer-program product of claim 20, wherein the code for calibrating further comprises code for adjusting the clock such that all inaccuracies of clock edges are not greater than I.

25. The computer-program product of claim 20, wherein the instructions further comprise:
   code for defining I, E, and C for a plurality of clocks;
   code for monitoring the largest inaccuracy of edges of the clocks; and
   code for calibrating the clocks if the largest inaccuracy of any clock edge is greater than (C−I).

26. The computer-program product of claim 20, wherein two clocks are treated as synchronous if a difference between their adjacent edges is smaller than 2C.

27. The apparatus of claim 1, further comprising instructions executable to display, in the simulation tool, clock edges as a function of E.

* * * * *